United States Patent [19]

Sweeney et al.

[11] Patent Number: 5,550,486
[45] Date of Patent: Aug. 27, 1996

[54] CIRCUIT AND METHOD FOR PROVIDING A KNOWN LOGIC STATE AT INSUFFICIENT SUPPLY VOLTAGE

[75] Inventors: Frank J. Sweeney, Rowlett; Apparajan Ganesan, Manchacha, both of Tex.

[73] Assignee: Texas Instruments Incorporated, Dallas, Tex.

[21] Appl. No.: 396,849

[22] Filed: Mar. 1, 1995

[51] Int. Cl.⁶ .................... H03K 19/007; H03K 17/16
[52] U.S. Cl. ................ 326/14; 326/33; 326/121; 326/87
[58] Field of Search .................... 326/94, 33, 121, 326/83, 87, 14

[56] References Cited

U.S. PATENT DOCUMENTS

| | | | |
|---|---|---|---|
| 4,477,741 | 10/1984 | Moser, Jr. | 326/33 |
| 4,638,187 | 1/1987 | Boler et al. | 326/87 |
| 4,825,101 | 4/1989 | Walters, Jr. | 326/87 |
| 5,089,722 | 2/1992 | Amedeo | 326/87 |
| 5,149,991 | 9/1992 | Rogers | 326/87 |
| 5,206,545 | 4/1993 | Huang | 326/87 |
| 5,220,209 | 6/1993 | Seymour | 326/87 |
| 5,438,280 | 8/1995 | Sugawara | 326/33 |

Primary Examiner—Edward P. Westin
Assistant Examiner—Richard Roseen
Attorney, Agent, or Firm—Alan K. Stewart; Richard L. Donaldson; William E. Hiller

[57] ABSTRACT

A circuit and method to force an output of a logic circuit to a known state when its supply voltage rises above a predetermined level includes an MOS logic transistor (122) connected between the supply voltage (129) and the output line (130) and connected to receive an input signal (126) on its gate. An MOS state controlling transistor (124) of opposite conductivity type from the MOS logic transistor (122) is connected between the output line (130) and a reference potential ($-V_{ss}$), with its gate connected to the gate of the MOS logic transistor (122). A resistor (132) is connected between the supply voltage (128) and the gate of the MOS state controlling transistor (124). If the supply voltage (128) rises above the predetermined level established by the threshold voltage of the MOS state controlling transistor, the MOS state controlling transistor (124) conducts to produce the reference potential on the output line (130). In one embodiment (120), the MOS state controlling transistor (124) is an NMOS transistor and the MOS logic transistor (122) is a PMOS transistor.

20 Claims, 6 Drawing Sheets

CIRCUIT AND METHOD FOR PROVIDING A KNOWN LOGIC STATE AT INSUFFICIENT SUPPLY VOLTAGE

BACKGROUND OF THE INVENTION

1. Field of the Invention

This invention relates to improvements in logic circuits or the like, and more particularly to improvements in circuits and methods for producing a known output logic state at insufficient supply

2. Relevant Background

In the design of typical logic cells, commonly an inverter circuit that includes two transistors is found. One transistor is generally connected between an output node and a supply rail, and the other transistor is generally connected between the output node and a reference supply rail, or ground. The control elements of the transistors receive an input, or control, voltage. In CMOS circuitry, for example, a typical inverter logic circuit which may be found has a p channel MOS (PMOS) transistor connected in series with an n channel MOS (NMOS) transistor between a supply voltage and ground, or a reference potential.

When the input voltage is low, for instance, the transistor connected to the supply rail is turned on, thereby conducting the supply voltage to the output node. On the other hand, when the input voltage is high, the other transistor is turned on, to connect the output node to the reference potential, or ground. As logic input signal is applied simultaneously to the gates of both transistors, the output is derived from their common drains.

Typically, such transistors are designed with low voltage thresholds in order to meet the desired circuit specifications. Both transistors are normally designed to have a $V_t$ that is sufficiently less than the supply voltage required for the output to be in a desired state during normal operation. In the construction or fabrication of such semiconductor logic circuits, however, it is often desirable that the logic circuit provide a known output when the power supply voltage is within a predetermined, typically insufficient, voltage range. For example, on power up of a circuit, as the power supply voltage begins to rise, the output of the circuit may be indeterminate until the voltage reaches a predetermined threshold. If the circuit were to be used, for instance, to provide a reset signal to downstream circuits, an indeterminate output state might allow the downstream circuits themselves to assume unknown or indeterminate states. This is, of course, undesirable. Thus, in such case, generally it is desirable to force the output of the circuit to a known output state, at such insufficient supply voltages, rather than allow the circuit to exhibit such possible indeterminate state.

SUMMARY OF THE INVENTION

In light of the above, therefore, it is an object of the invention to provide a logic circuit that produces a known output state when a supply voltage is insufficient.

It is another object of the invention to provide a method for causing a logic circuit to produce a known output state when a supply voltage is insufficient.

It is yet another object of the invention to provide a NOR gate circuit that produces a known output state when a supply voltage is insufficient.

It is another object of the invention to provide an NAND gate circuit that produces a known output state when a supply voltage is insufficient.

These and other objects, features and advantages of the invention will be apparent to those skilled in the art from the following detailed description of the invention, when read in conjunction with the accompanying drawings and appended claims.

According to a broad aspect of the invention, a logic circuit is provided that forces its output line to a known state when a supply voltage rises above a predetermined voltage, which is less than the normal logic voltage of the circuit. The logic circuit includes an MOS logic transistor connected between the supply voltage and the output line, with the input logic signal to the circuit connected to its gate. An MOS state controlling transistor of opposite conductivity type from the MOS logic transistor is connected between the output line and a reference potential, with its gate connected to the gate of the MOS logic transistor and the supply voltage. A resistor is connected between the supply voltage and the gate of the MOS state controlling transistor. If the supply voltage is above a predetermined level, the MOS state controlling transistor conducts to connect the reference potential to the output line. In one embodiment, the MOS state controlling transistor is an NMOS transistor and the MOS logic transistor is a PMOS transistor.

According to another broad aspect of the invention, a logic circuit is presented that forces its output to a known state when a supply voltage rises above a predetermined voltage, which is lower than the normal supply voltage of the circuit. The logic circuit includes a pair of MOS logic transistors of opposite conductivity type connected in series between the supply voltage and a reference potential. The logic circuit includes an MOS state controlling transistor having a threshold voltage less than a threshold voltage of one of the MOS logic transistors across which it is connected in parallel. The MOS state controlling transistor and the MOS logic transistor across which it is connected are of the same conductivity type. The control element of the MOS state controlling transistor is connected to the control element of one of the MOS logic transistors and to a voltage to which the MOS logic transistor to which it is connected is referenced. If the supply voltage rises above the threshold voltage of the MOS state controlling transistor, the MOS state controlling transistor conducts to produce the known logic state at the output of the logic circuit.

The MOS state controlling transistor and the MOS logic transistor across which it is connected may both be either PMOS transistors or NMOS transistors. In the case of PMOS transistors, a resistor may be connected between the control element of the PMOS state controlling transistor and the reference potential. In the case of NMOS transistors, the resistor may be connected between the control element of the NMOS state controlling transistor and the voltage source.

According to yet another broad aspect of the invention, a circuit of similar construction to that above described is presented, in which a pair of MOS state controlling transistors each having a threshold voltage less than a threshold voltage of one of the MOS logic transistors, are connected in series, the series being connected in parallel with the MOS logic transistor. The control elements of the MOS state controlling transistors are connected to a voltage to which the MOS logic transistors are referenced.

According to yet another broad aspect of the invention, a NOR circuit is provided. The NOR circuit has a first pair of MOS logic transistors of the same conductivity type connected in series between a supply voltage and an output line. Each of the MOS logic transistors has a control element connected to a respective logic signal input line. A second pair of MOS logic transistors of the same conductivity type is connected in parallel between the output line and a reference potential. The first and second pairs of MOS logic transistors are of opposite conductivity type, each having a control element connected to a respective logic signal input line. An MOS state controlling transistor having a threshold voltage less than the threshold voltage of one of the MOS logic transistors of the second pair of MOS logic transistors is connected in parallel with the transistors of the second pair of MOS logic transistors. The MOS state controlling transistor and the one of the second pair of MOS logic transistors are of the same conductivity type. The MOS state controlling transistor has its control element connected to one of the logic signal input lines and through a resistor to the supply voltage. As the supply voltage rises above the threshold voltage of the MOS state controlling transistor, it conducts to produce the known logic state on the output line. In one embodiment, the MOS state controlling transistor and the transistors of the second pair of MOS logic transistors across which it is connected are NMOS transistors. The resistor is connected between the control element of the MOS state controlling transistor and the voltage source to provide the voltage source to the control element of the MOS state controlling transistor.

According to yet another broad aspect of the invention, an NAND circuit is presented that has a first pair of MOS logic transistors of the same conductivity type connected in series between a reference potential and an output line. Each of the MOS logic transistors has a control element connected to a respective logic signal input line. A second pair of MOS logic transistors of the same conductivity type is connected in parallel between the output line and a supply voltage. The first and second pairs of MOS logic transistors are of opposite conductivity type, each having a control element connected to a respective logic signal input line. An MOS state controlling transistor having a threshold voltage less than a threshold voltage of one of the MOS logic transistors of the second pair of MOS logic transistors is connected in parallel with the one of the MOS logic transistors of the second pair of MOS logic transistors. The MOS state controlling transistor and the one of the second pair of MOS logic transistors are of the same conductivity type, the MOS state controlling transistor having its control element connected to one of the logic signal input line. As the supply voltage rises above the threshold voltage of the MOS state controlling transistor, it conducts to produce the known logic state on the output line.

In one embodiment, the MOS state controlling transistor and the one of the MOS logic transistors of the second pair of MOS logic transistors across which it is connected are PMOS transistors. A resistor may also be connected between the control element of the MOS state controlling transistor and the reference potential to provide the reference potential on the control element of the MOS state controlling transistor.

According to still another broad aspect of the invention, a method is presented for forcing a logic circuit to produce an output of known state as a supply voltage rises above a predetermined voltage level. The logic circuit with which the method is performed includes an MOS logic transistor connected between the supply voltage and the output line, connected to receive an input signal on its gate. The method includes the step of connecting an output line of the logic circuit to a line at the desired known state by an output control transistor, which has a lower threshold voltage than a threshold voltage of a transistor of the logic circuit. The supply voltage is connected to a control element of the output control transistor.

BRIEF DESCRIPTION OF THE DRAWING

The invention is illustrated in the accompanying drawing, in which.

DETAILED DESCRIPTION OF THE PREFERRED EMBODIMENTS

Figure 1:
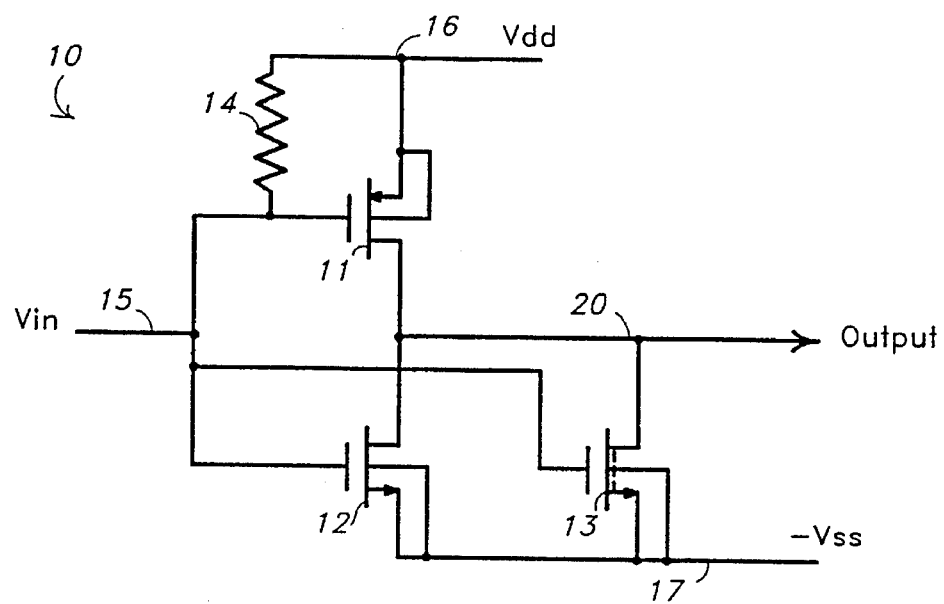
FIG. 1 is an electrical schematic diagram of an inverter circuit that is forced to produce a low output logic state when the supply voltage rises above a predetermined voltage, in accordance with a preferred embodiment of the invention.

It should be noted that the process steps and structures herein described do not necessarily include a complete process flow for manufacturing integrated circuits. It is anticipated that the present invention may be practiced in conjunction with integrated circuit fabrication techniques currently used in the art, and only so much of the commonly practiced process steps are included as are necessary for an understanding of the present invention.

According to a preferred embodiment of the invention, through the use of a resistor and a low threshold voltage (low $V_t$) device in conjunction with devices providing an existing logic function, a desired state at low supply voltages can be achieved, with higher $V_t$ transistors for the existing logic function. More particularly, with reference to FIG. 1, a circuit 10 is provided that includes a typical inverter logic circuit that has a p channel metal oxide semiconductor (PMOS) logic transistor 11 and an n channel metal oxide logic semiconductor (NMOS) transistor 12 connected in series between a plus supply rail 16 ($V_{dd}$) and minus supply rail 17 ($-V_{ss}$). (The minus supply rail 17 may be, for example, a reference potential or ground.) The input to the circuit 10 is applied on an input line 15 to the gates of the PMOS transistor 11 and NMOS transistor 12. The output of the circuit 10 is derived on an output line 20 from the common drains of the PMOS transistor 11 and NMOS transistor 12. The PMOS transistor 11 and NMOS transistor 12 are devices which have relatively high threshold voltages, $V_t$.

In the embodiment of FIG. 1, it is assumed that as the supply voltage rises above a predetermined voltage, while still insufficient to provide reliable circuit operation and logic functions, the logic state on the output line 20 is to be at a low, or logical "0" state. To assure that the circuit 10 assumes the desired low output state at such low supply voltages, a resistor 14 is connected between the gate of the PMOS transistor 11 and the supply rail 16. Additionally, an NMOS state controlling transistor 13 is connected with its drain connected to the output line 20 and its source connected to the minus supply rail 17. The gate of the NMOS transistor 13 is connected to the input line 15, or the gates of the logic transistors 11 and 12.

In the fabrication of the circuit 10, the NMOS transistor 13 is constructed with a voltage threshold $V_t$ that is low, or small relative to the voltage threshold of the NMOS transistor 12 across which it is connected. Since the supply voltage $V_{dd}$ is applied to the gate of the PMOS transistor 13 by the resistor 14, the gate-to-source voltage of the NMOS transistor 13 will be that of the supply voltage except when the gate voltage is pulled low by the input voltage on input line 15.

In operation, when, for example, the circuit 10 is powered up, the voltage between the gate and source of the NMOS transistor 13 rises to follow the increasing supply voltage on line 16. Until the supply voltage reaches the threshold voltage of the NMOS transistor 13, the output of the circuit is indeterminate. As the supply voltage reaches and exceeds the threshold voltage of the NMOS transistor 13, the NMOS transistor 13 is turned on, connecting the output line 20 to the reference potential on line 17, at a logic "0" state. As the supply voltage continues to rise to a level above the threshold voltage of the NMOS logic transistor 12, the circuit 10 will operate normally, with the NMOS transistor now operating in a similar fashion as that of transistor 12.

Figure 2:
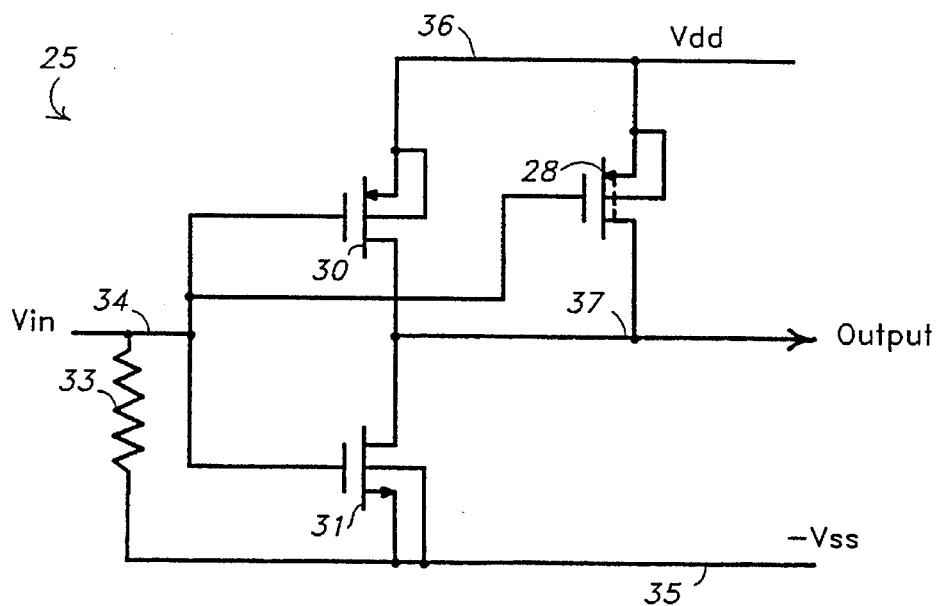
FIG. 2 is an electrical schematic diagram of an inverter circuit that is forced to produce a high output logic state as the supply voltage rises above a predetermined voltage, in accordance with a preferred embodiment of the invention.

Another embodiment 25 of the circuit of the invention is shown in FIG. 2. In the circuit embodiment 25, a logic inverter circuit that includes series connected PMOS logic transistor 30 and NMOS logic transistor 31 is connected between a supply voltage rail ($V_{dd}$) 36 and a reference rail 35 (-Vss). The input, $V_{in}$, on an input line 34 is connected to the gates of the transistors 30 and 31, and the output is derived on line 37 at the common drains of the transistors 30 and 31.

It is desired that the output from the circuit 25 be forced to a logic "high" or "1" state at insufficient supply voltages. Accordingly, the circuit 25 includes a resistor 33 connected between the input line 34 and the reference rail 35. A PMOS state controlling transistor 28 is connected between the supply rail 36 and the output line 37, in parallel with the PMOS transistor 30, with its gate connected to the input line 34. The PMOS transistor 28 is constructed with a voltage threshold, $V_t$, that is low, or small (i.e., more positive) relative to the voltage threshold of the PMOS transistor 30. The operation of the circuit 25 is similar to that of the circuit 10 above described with reference to FIG. 1, except that the output on line 37 is forced to be a logical "one" or "high" state at low supply voltages above the threshold value of the PMOS transistor 28.

Thus, in the operation of the circuit 25, the resistor 33 applies the voltage on the negative supply line 35 to the gates of the PMOS transistors 28 and 30. When the circuit is, for example, powered up, until the supply voltage on line 36 rises to a level that produces a gate-source voltage ($V_{in}-V_{dd}$) above the threshold value of the PMOS transistor 28, the PMOS transistor 28 does not operate in the circuit. When the supply voltage on line 36 rises to a level that produces the voltage between the gate and source of the PMOS transistor 28, the PMOS transistor 28 begins to conduct, connecting the supply voltage on the supply line 36 to the output line. As the supply voltage continues to increase, the PMOS transistor 30 becomes effective in the circuit, and is responsive to the logic state applied to the input line 34.

It will be appreciated that MOS devices which have a low threshold voltage, $V_t$, can be "leaky"; for example, a low $V_t$ NMOS devices may draw some drain-to-source current when the gate-to-source voltage is low. This is undesirable. To reduce such "leakage," two or more low $V_t$ MOS transistors can be stacked in a common-gate, common-substrate configuration, as shown in the circuits 40 and 55, respectively in FIGS. 3 and 4.

Figure 3:
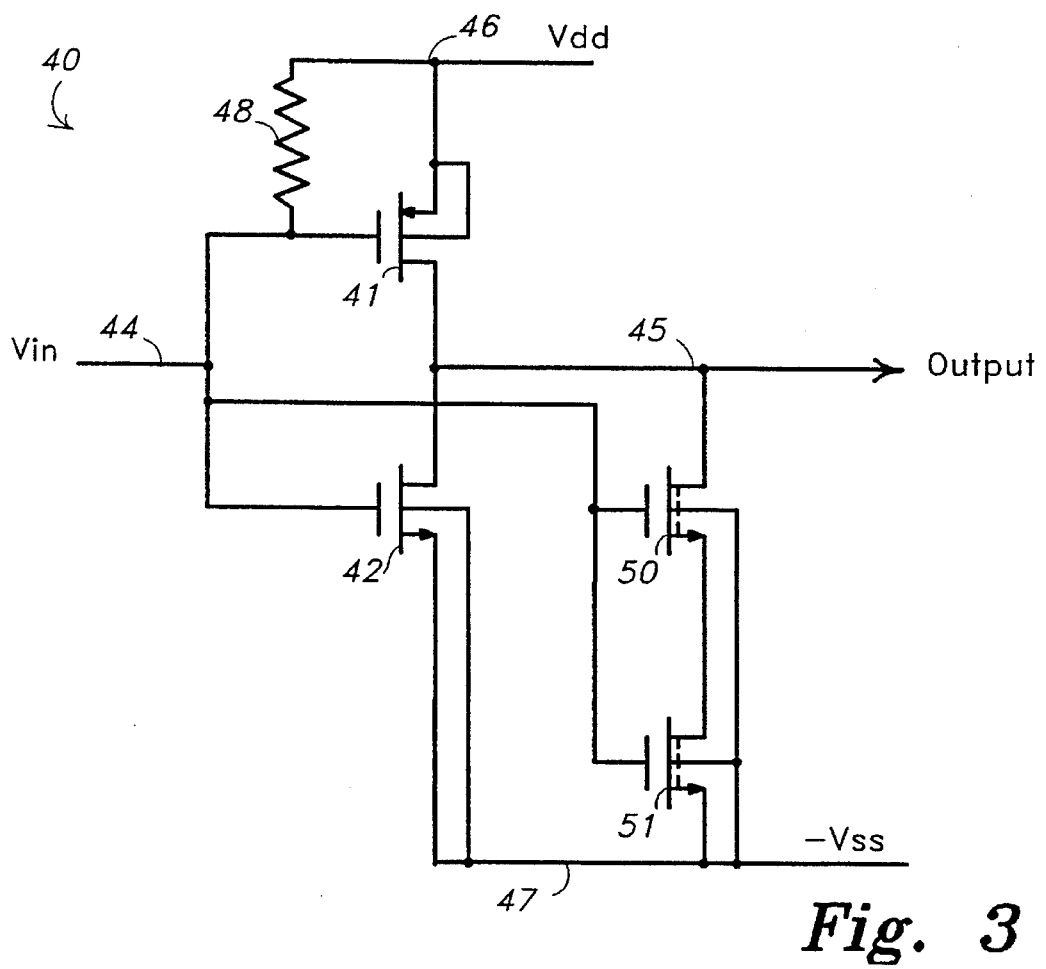
FIG. 3 is an electrical schematic diagram of an inverter circuit that is forced to produce a low output logic state as the supply voltage rises above a predetermined voltage, with reduced current leakage, in accordance with a preferred embodiment of the invention.

With reference first to FIG. 3, the circuit 40 has a logic inverter circuit that includes a PMOS logic transistor 41 in series with an NMOS logic transistor 42, the series being connected between a voltage source, $V_{dd}$, rail 46 and a reference potential, $-V_{ss}$, or ground, rail 47. The input, $V_{in}$, is connected on an input line 44 to the gates of the transistors 41 and 42. The output is obtained at the drains of the transistors 41 and 42 on output line 45.

A resistor 48 is connected between the voltage source on rail 46 and the gates of the transistors 41 and 42, as well as to the gates of NMOS state controlling transistors 50 and 51. The transistors 50 and 51 are connected in series between the output line 45 and the reference potential rail 47, as shown. Moreover, the voltage threshold, $V_t$, of the transistors 50 and 51 are set to be substantially less than the voltage threshold of the NMOS transistor 42, so that they will begin to conduct as the supply voltage on rail 46 rises above the low voltage threshold. Thus, the output seen on line 45 is forced low when the supply voltage exceeds the predetermined level established by the voltage threshold of the NMOS transistors 50 and 51.

The potential that exists on the node between the source of the transistor 50 and the drain of the transistor 51 results in a source-to-substrate potential for transistor 50. This causes the voltage threshold, $V_t$, of transistor 50 to increase, due to its body-effect. The increase in $V_t$ of transistor 50 reduces the resultant "leakage" in the circuit.

Figure 4:
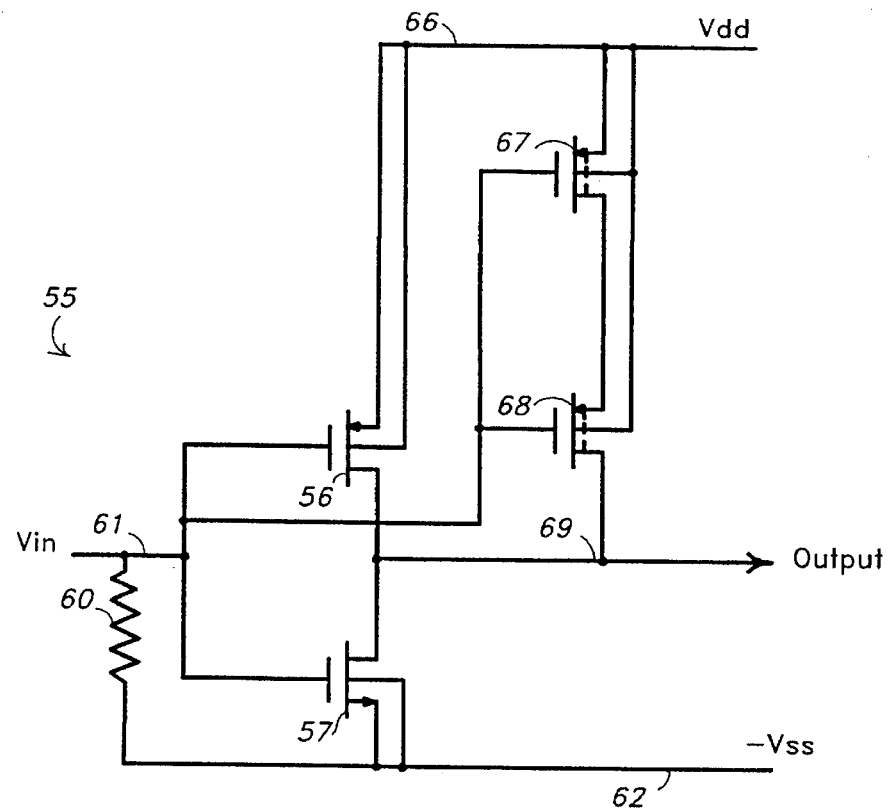
FIG. 4 is an electrical schematic diagram of an inverter circuit that is forced to produce a high output logic state as the supply voltage rises above a predetermined voltage, with reduced current leakage, in accordance with a preferred embodiment of the invention.

The circuit 55 of FIG. 4 is similar to that described above with reference to the circuit 40 of FIG. 3, except that the transistor types are reversed. More particularly, the circuit 55 has a logic inverter circuit that includes a PMOS logic transistor 56 in series with an NMOS logic transistor 57, the series being connected between a voltage source, $V_{dd}$, rail 66 and a reference potential, $-V_{ss}$, or ground, rail 62. The input, $V_{in}$, is connected on the input line 61 to the gates of the logic transistors 56 and 57, and the output is obtained at the drains of the logic transistors 56 and 57 on an output line 69.

A resistor 60 is connected between the reference potential rail 62 and the gates of the logic transistors 56 and 57, as well as to the gates of PMOS state controlling transistors 67 and 68. The transistors 67 and 68 are connected in series between the output line 69 and the voltage source 66, as shown. The voltage threshold, $V_t$, of the transistors 67 and 68 are set to be substantially less than that of the PMOS transistor 56, so that they will begin to conduct when the supply voltage on rail 66 rises above a predetermined voltage level of the transistors 67 and 68, referenced to the reference potential on line 62. Thus, the output seen on line 69 is forced high when the supply voltage rises above the predetermined level.

As with the circuit 40 described above, the drain-to-source potential seen at the node between the source of the transistor 68 and the drain of the transistor 67 results in a source-to-substrate potential for transistor 68. This causes the voltage threshold, $V_t$, of transistor 68 to increase, due to its body-effect. The increase in $V_t$ of transistor 68 reduces the resultant "leakage" in the circuit.

Figure 5:
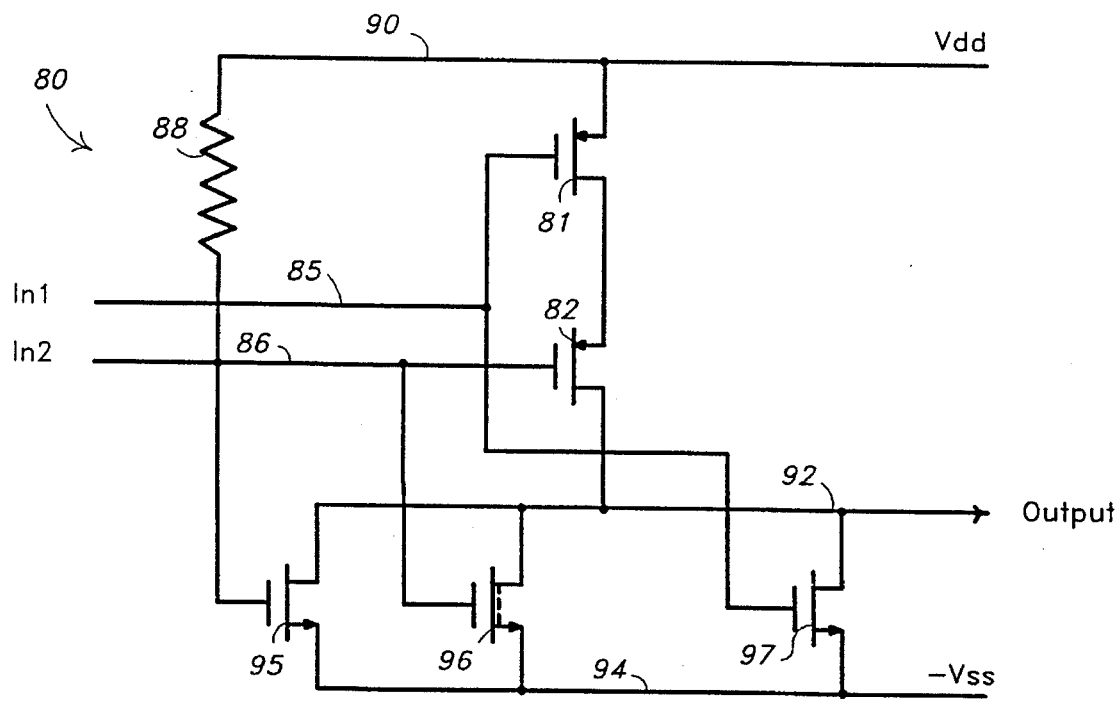
FIG. 5 is an electrical schematic diagram of a two input NOR gate circuit that is forced to produce a low output logic state as the supply voltage rises above a predetermined voltage, in accordance with a preferred embodiment of the invention.

The circuit, according to the invention, to switch the logic circuit with it is associated to assume a known logic state at insufficient supply voltages can be used in combination with virtually any logic circuitry addition to inverter circuits described above. For example, in FIG. 5, such combination is shown in the context of a NOR gate 80. The NOR gate 80 has two PMOS logic transistors 81 and 82 connected in series between a supply voltage on rail 90 and an output line 92. A first input In1 is connected on an input line 85 to the gate of the transistor 81, and a second input In2 is connected on input line 86 to the gate of the transistor 82.

In addition, a pair of NMOS logic transistors 95 and 97 are connected in parallel with each other, each also being connected between the output line 92 and a reference potential, $-V_{ss}$, or ground, rail 94. The input In1 on input line 85 is connected to the gate of the transistor 97, and the input In2 on input line 86 is connected to the gate of the transistor 95.

In order to cause the circuit 80 to assume a known logic state as the supply voltage on rail 90 rises above a predetermined level, a resistor 88 is connected between the supply rail 90 and one of the input lines, such as the input line 86. The resistor 88 is also connected to the gate of an NMOS state controlling transistor 96, which has a voltage threshold, $V_t$, lower than that of the NMOS transistors 95 and 97. Thus, when the supply voltage on the line 90 rises above the predetermined level established by the voltage threshold of the NMOS transistor 96, the NMOS transistor 96 begins to conduct, forcing the output line 92 to assume the low logic state on rail 94. It should be noted that the resistor 88 and the gate of NMOS transistor 96 can alternatively be connected to the other input line 85, if desired.

It will be appreciated that although the NOR circuit 80 has only two inputs, any number of inputs can be provided by merely stacking the series and parallel transistors. Such stacking techniques, of course, are valid for other logic functions, as well.

Figure 6:
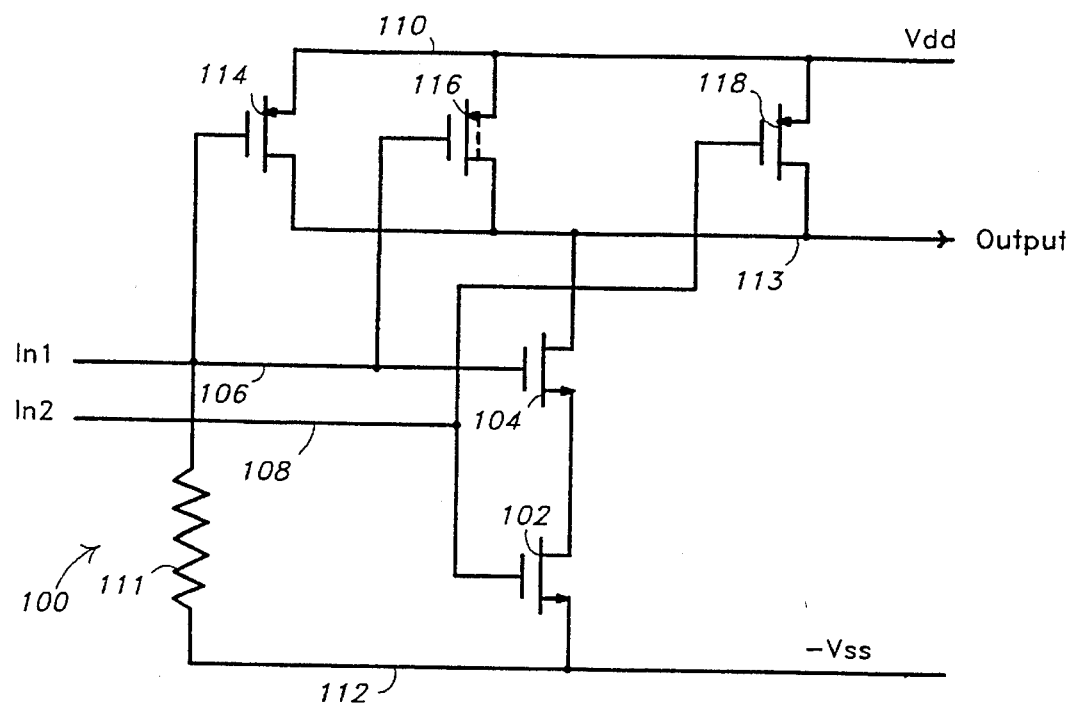
FIG. 6 is an electrical schematic diagram of a two input NAND gate circuit that is forced to produce a high output logic state as the supply voltage rises above a predetermined voltage, in accordance with a preferred embodiment of the invention.

For example, a similar circuit 100 is shown in FIG. 6 to provide a logic NAND function. The circuit 100 has two NMOS logic transistors 102 and 104 connected in series between the output line 113 and a reference potential, $-V_{ss}$, or ground, rail 112. Two input signals, In1 and In2, are applied to the respective gates of the transistors 104 and 102 on respective input lines 106 and 108.

A pair of PMOS transistors 114 and 118 are connected in parallel with each other, each being connected between the output line 113 and the voltage supply rail 110. The gates of the transistors 114 and 118 are connected respectively to the input lines 106 and 108.

In order to cause the circuit 100 to assume a known logic state at its output when the supply voltage rises above a predetermined voltage level, a resistor 111 is connected between the reference potential rail 112 and one of the input lines, such as the input line 106 shown. The resistor 111 is also connected to the gate of a PMOS state controlling transistor 116. The PMOS transistor 116 is connected in parallel with the PMOS transistors 114 and 118, and has a voltage threshold, $V_t$, lower than either of the PMOS transistors 114 and 118. Thus, as the supply voltage seen on line 110 rises above the threshold value of the PMOS transistor 116 with respect to the reference potential on line 112, the PMOS transistor 116 conducts, connecting the supply voltage (a high logic state) to the output line 113. Again, although the NAND circuit 100 has only two inputs, any number of inputs can be provided by merely stacking the series and parallel transistors.

Although the circuits illustrated above each have the state controlling transistors which have a low voltage threshold, $V_t$, in parallel with one of the logic transistors, such connections are not necessarily always required. Such parallel circuits are usually preferred, however, since devices that have a low voltage threshold, $V_t$, tend to be "leaky" as earlier described, and the parallel combination allows for smaller, low $V_t$ devices to be used, which tend to be less "leaky" than larger devices.

Figure 7:
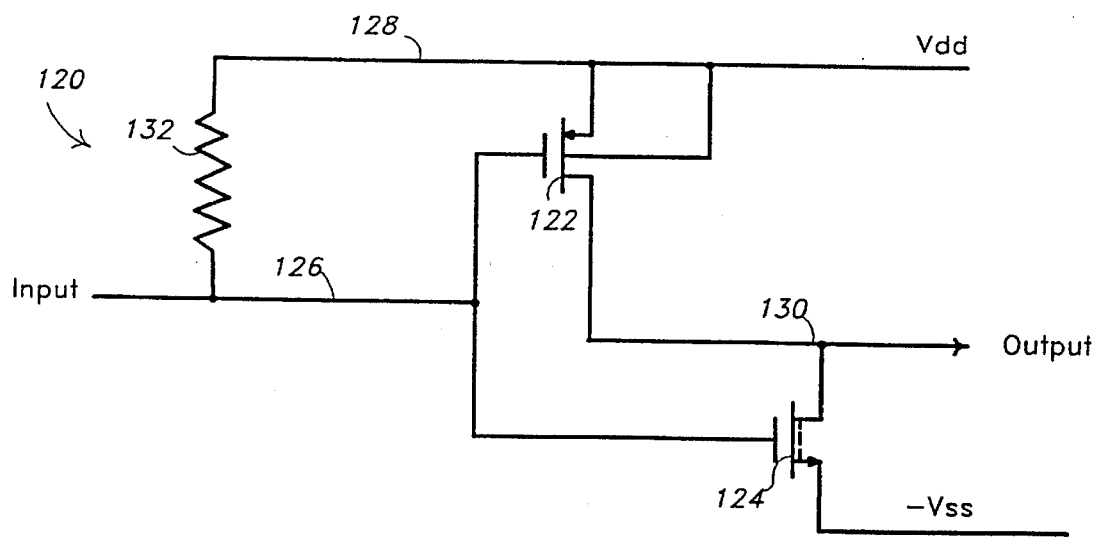
FIG. 7 is an electrical schematic diagram of an inverter circuit that is forced to produce a low output logic state as the supply voltage rises above a predetermined voltage, in accordance with a preferred embodiment of the invention.

An example of a circuit 120 which does not employ the parallel transistor is shown in FIG. 7. The circuit 120 has a state controlling transistor 124, which has a low voltage threshold, $V_t$, connected directly between the output line 130 and the logic level $-V_{ss}$ to which the output is to be pulled at insufficient supply voltages. The control element, or gate, of the NMOS transistor 124 is connected to the supply line 128 and input (or reference potential and input) line 126 by a resistor 132.

Thus, for instance, the circuit 120 of FIG. 7 has a PMOS logic transistor 122 connected between the supply rail 128 and the output line 130. The input signal on line 126 is applied to the gate of the transistor 122, as well as to the gate of an NMOS transistor 124. As the supply voltage on the supply rail 128 rises and exceeds the threshold voltage of the NMOS transistor 124, the NMOS transistor 124 conducts, forcing the output on line 130 to the reference potential, $-V_{ss}$.

Figure 8:
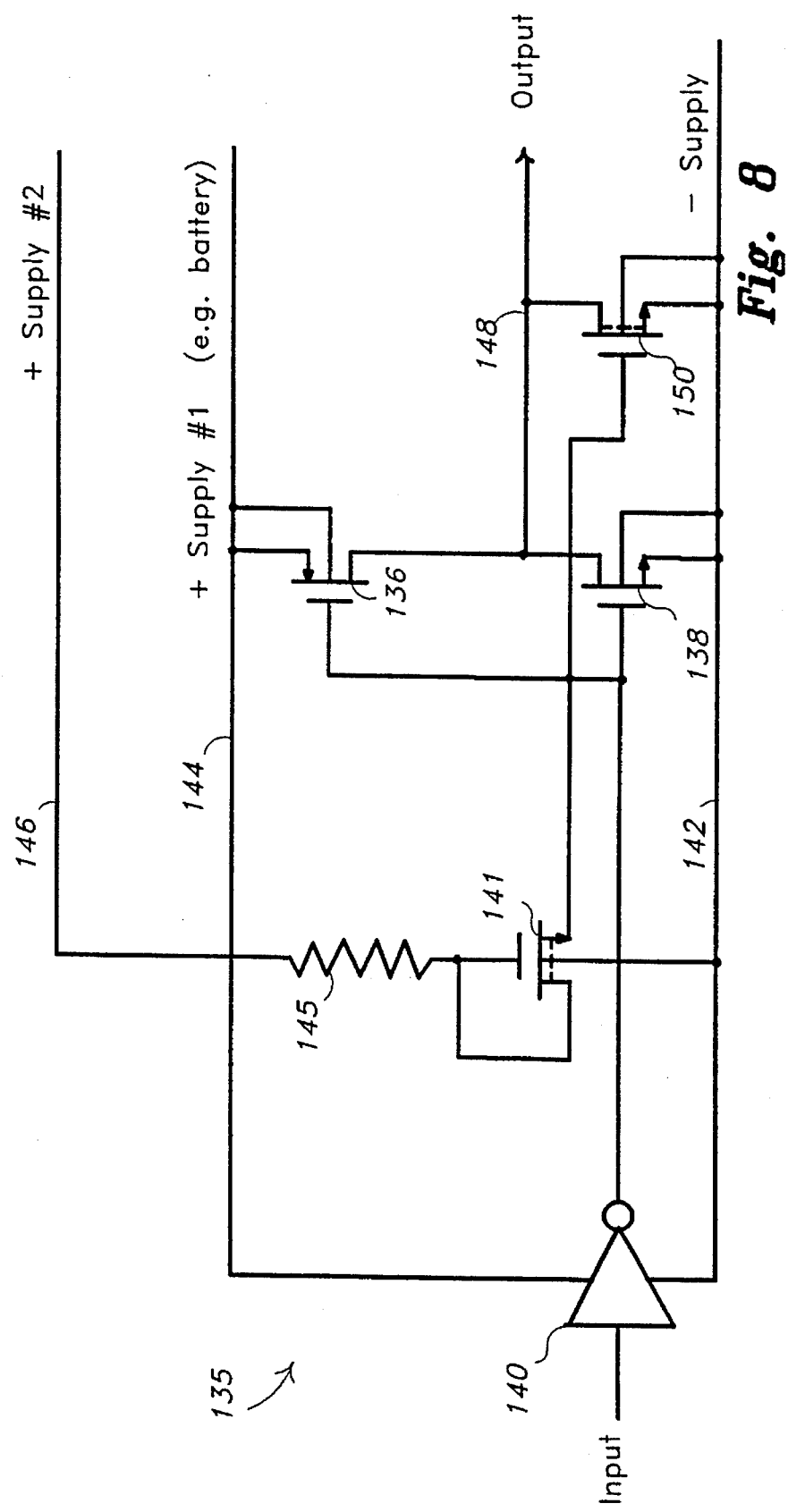
FIG. 8 is an electrical schematic diagram of a circuit that produces a low output logic state as one of two supply voltages rises above a predetermined voltage, in accordance with a preferred embodiment of the invention.

In some circuits, such as a power supervisory circuit for a microprocessor, or the like, the chip on which the microprocessor is constructed may have multiple voltage supplies. For example, such circuits may have a main power supply for powering circuitry under normal operation and a battery supply to provide power when the main supply voltage is below a certain value. The supervisory circuit may have an output that switches between these supplies. This output is used to control the power of other circuits and to control the power to the supervisor itself. An example of such circuit 135 is shown in FIG. 8.

Typically, the desired logic state is provided at the output of the circuit when the main supply reaches a specific voltage level. Thus, the circuit 135 has a PMOS logic transistor 136 and NMOS logic transistor 138 connected in series between a first positive supply line 144 and a negative supply line 142. The output is derived from the common drains of the transistors 136 and 138 on the output line 148. The input to the circuit 135 is provided by an inverter 140, connected to the gates of the transistors 136 and 138. In the circuit 135, a second positive voltage supply is provided on line 146.

The first positive voltage supply on line 144 may be, for instance, a switched output providing power to the chip, and the second positive voltage supply on line 146 may be the main supply. The first positive voltage supply may be, for instance, provided by a battery supply (not shown) or other suitable supply.

The second power supply is connected by a resistor 145 to the gate and drain of a first NMOS transistor 141, which controls the gate of a second NMOS state controlling transistor 150, which is connected between the output on line 148 and the negative power supply on line 142. The NMOS transistor 141 and the NMOS transistor 150 are constructed with a threshold voltage that is lower than the threshold voltage of the NMOS transistor 138. The circuit, therefore, operates normally to provide on the output line 148 the signal at the input to the inverter 140, so long as the level of the voltage on the first positive supply line 144 remains above the voltage level required to operate the inverter 140, the PMOS transistor 136, and the NMOS transistor 138. Additionally, so long as the voltage on the second supply line remains above the threshold of the state controlling transistors 141 and 150, the output line 148 is connected to the minus supply line 142, therefore forcing the output line 148 to a logic low state, if the supply voltage on line 144 is insufficient.

In the circuit of FIG. 8, the purpose of the transistor 141 is to prevent a potential leakage path through the resistor 145 through which current might otherwise flow from the battery supply to the main supply. This is especially true when the gates of the logic circuit transistors are driven to a logic high state. In general, any leakage current on a battery supply is considered undesirable, since even a few microamperes of current may be significant to the lifetime of the battery. Thus, the value of the resistor employed would desirably be relatively large to minimize or reduce such leakage. This can use significant area on a chip and still be an inadequate solution.

The problem is resolved, however, through the use of the low threshold voltage gate-drain transistor 141 in series with the resistor 145. Thus, in the circuit 135, the resistor 145 may be a small resistor whose primary purpose is to protect the gate of transistor 141. If the first voltage supply on line 144 is provided by a battery and the second positive voltage on line 146 is less than the first voltage supply on line 144, then the transistor 141 acts as a reversed biased diode and blocks leakage current from the battery, particularly if gates of the transistors 136 and 138 are driven to a logic high state.

By adjusting the width and length dimensions of transistor 141, the transistor 141 can appear as a very large resistor under the conditions of interest. One disadvantage of using the series transistor 141, however, is that it adds an additional voltage threshold, $V_t$, to the circuit. Thus, the desired logic state will not be obtained at as low a supply voltage as could be obtained if resistors were used alone.

Figure 9:
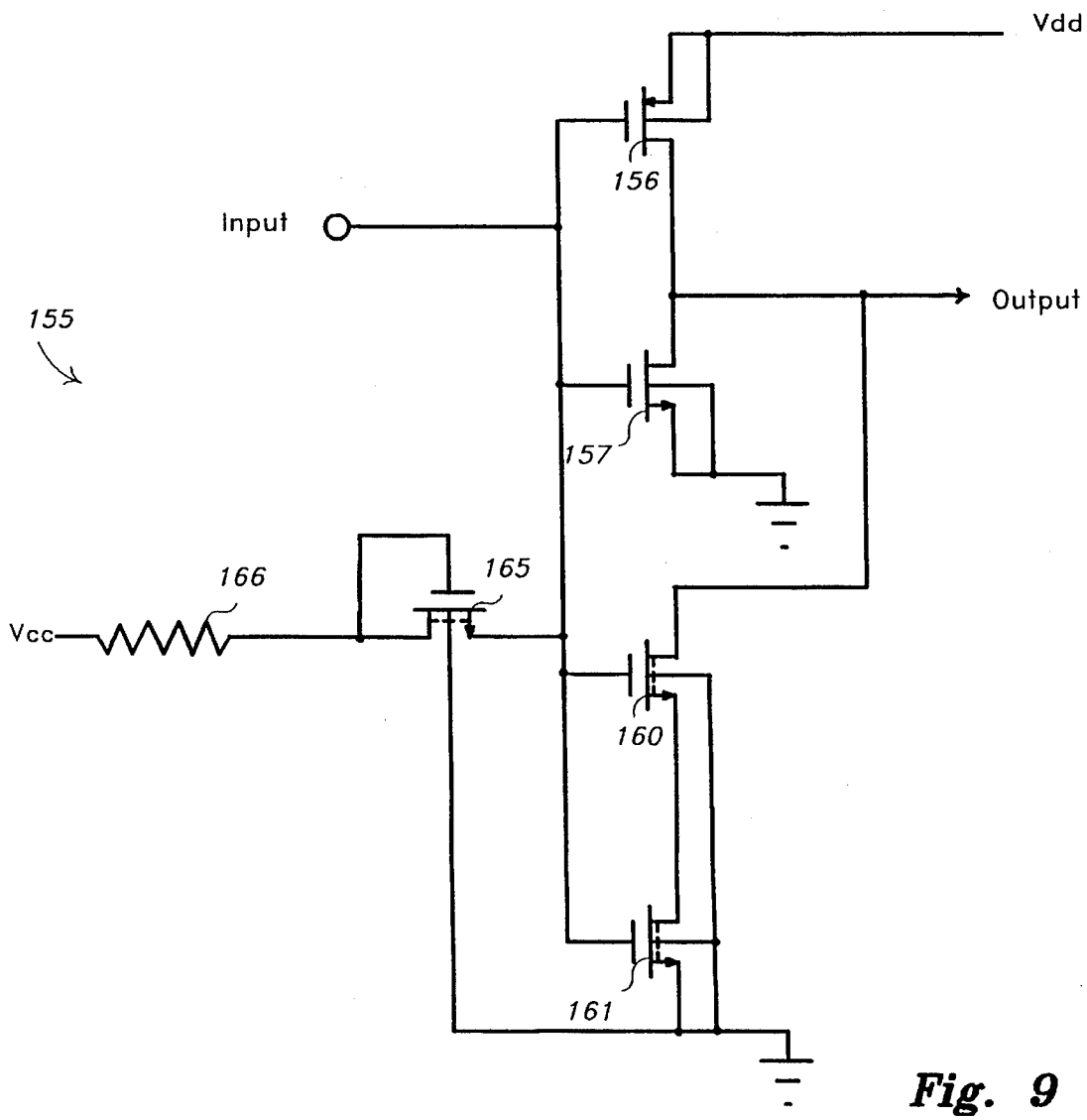
FIG. 9 is an electrical schematic diagram of a circuit that embodies both stacked state controlling transistors and a leakage current protecting transistor, in accordance with another preferred embodiment of the invention.

Another circuit embodiment, according to a preferred embodiment of the invention is shown in FIG. 9. The circuit 155 embodies both the stacked state controlling transistors 160 and 161, and the leakage current protecting transistor 165. The transistors 160, 161, and 165 are all NMOS devices, having a lower voltage thresholds than the logic transistors 156 and 157, which form the logic inverter. In a practical integrated circuit embodiment, for instance, the resistor 166 may have a value of 3.83 MΩ. The NMOS transistors 160 and 161 can be constructed to have a channel length to width ratio of about $4/72$, and the PMOS transistors 156 and 157 can be constructed to have a channel length to width ratio of about $1.25/300$ and $1.25/125$, respectively. The circuit 155 can be used, for example, as a part of a power supervisor circuit.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

We claim:

1. A logic circuit having an output line that assumes a known state when a supply voltage rises above a predetermined level, said logic circuit including an MOS logic transistor connected between a supply voltage source and the output line and connected to receive an input signal on a gate thereof, said MOS logic transistor having a first voltage threshold, comprising:

an MOS state controlling transistor having a threshold voltage less than the first voltage threshold, said MOS state controlling transistor and said MOS logic transistor being of opposite conductivity type;

said MOS state controlling transistor being connected between the output line and a reference potential source, and having its gate connected to the gate of said MOS logic transistor;

a resistor connected between the supply voltage and the gate of said MOS state controlling transistor;

whereby if said supply voltage rises above the voltage threshold of said MOS state controlling transistor, said MOS state controlling transistor conducts to produce a reference potential on the output line.

2. The circuit of claim 1 wherein said MOS state controlling transistor is an NMOS transistor and said MOS logic transistor is a PMOS transistor.

3. A circuit to force a logic circuit to a known state when a supply voltage rises above a predetermined level, said logic circuit including a pair of MOS logic transistors of opposite conductivity type connected in series between a supply voltage source and a reference potential source, one of said MOS logic transistors is connected between the supply voltage source and an output line, comprising:

at least one MOS state controlling transistor having a threshold voltage less than a threshold voltage of one of said MOS logic transistors, said at least one MOS state controlling transistor and said one of said MOS logic transistors being of the same conductivity type;

said MOS state controlling transistor being connected in parallel with said one of said MOS logic transistors, and having a control element connected to an input voltage source to which a control element of said one of said MOS logic transistors is connected;

whereby if said supply voltage rises above the threshold of said MOS state controlling transistor, said MOS state controlling transistor conducts to produce said known logic state at the output line.

4. The circuit of claim 3 wherein said MOS state controlling transistor and said one of said MOS logic transistors are PMOS transistors.

5. The circuit of claim 3 wherein said MOS state controlling transistor and said one of said MOS logic transistors are NMOS transistors.

6. The circuit of claim 4 further comprising a resistor connected between said control element of said MOS state controlling transistor and said reference potential source.

7. The circuit of claim 5 further comprising a resistor connected between said control element of said MOS state controlling transistor and said supply voltage source.

8. A circuit to force a logic circuit to a known state when a supply voltage rises above a predetermined level, said logic circuit including a pair of MOS logic transistors of opposite conductivity type connected in series between a supply voltage source and a reference potential source, one of said MOS logic transistors is connected between the supply voltage source and an output line, comprising:

a pair of MOS state controlling transistors each having a threshold voltage less than a threshold voltage of one of said MOS logic transistors, said MOS state controlling transistors and said one of said MOS logic transistors being of the same conductivity type;

said pair of MOS state controlling transistors being connected in series, the series being connected in parallel with said one of said MOS logic transistors, and each having a control element connected to an input voltage source to which a control element of said one of said MOS logic transistors is connected;

whereby if said supply voltage rises above the threshold voltage of said MOS state controlling transistors, said pair of MOS state controlling transistors conducts to produce said known logic state at the output line.

9. The circuit of claim 8 wherein said pair of MOS state controlling transistors and said one of said MOS logic transistors are PMOS transistors.

10. The circuit of claim 8 wherein said pair of MOS state controlling transistors and said one of said MOS logic transistors are NMOS transistors.

11. The circuit of claim 9 further comprising a resistor connected between said control elements of said pair of MOS state controlling transistors and said reference potential source.

12. The circuit of claim 10 further comprising a resistor connected between said control elements of said pair of MOS state controlling transistors and said supply voltage source.

13. A NOR logic circuit, comprising:

a first pair of MOS logic transistors of the same conductivity type connected in series between a supply voltage source and an output line, each of said MOS logic transistors having a control element connected to a respective logic signal input line;

a second pair of MOS logic transistors of the same conductivity type connected in parallel between the output line and a reference potential source, said first and second pairs of MOS logic transistors being of opposite conductivity type, each of said second pair of MOS logic transistors having a control element connected to a respective logic signal input line;

and an MOS state controlling transistor having a threshold voltage less than a threshold voltage of one of said MOS logic transistors of said second pair of MOS logic transistors, said MOS state controlling transistor and said one of said second pair of MOS logic transistors being of the same conductivity type;

said MOS state controlling transistor being connected in parallel with said one of said MOS logic transistors of said second pair of MOS logic transistors, and having a control element connected to one of said logic signal input lines;

whereby if said supply voltage rises above the threshold voltage of said MOS state controlling transistor, said MOS state controlling transistor conducts to produce said known logic state on said output line.

14. The circuit of claim 13 wherein said MOS state controlling transistor and said one of said MOS logic transistors of said second pair of MOS logic transistors are NMOS transistors.

15. The circuit of claim 14 further comprising a resistor connected between said control element of said MOS state controlling transistor and said supply voltage source.

16. A NAND logic circuit, comprising:

a first pair of MOS logic transistors of the same conductivity type connected in series between a reference potential source and an output line, each of said MOS logic transistors having a control element connected to a respective logic signal input line;

a second pair of MOS logic transistors of the same conductivity type connected in parallel between the output line and a supply voltage source, said first and second pairs of MOS logic transistors being of opposite conductivity type, each of said second pair of MOS logic transistors having a control element connected to a respective logic signal input line;

and an MOS state controlling transistor having a threshold voltage less than a threshold voltage of one of said MOS logic transistors of said second pair of MOS logic transistors, said MOS state controlling transistor and said one of said second pair of MOS logic transistors being of the same conductivity type;

said MOS state controlling transistor being connected in parallel with said one of said MOS logic transistors of said second pair of MOS logic transistors, and having a control element connected to one of said logic signal input lines;

whereby if said supply voltage rises above the voltage threshold of said MOS state controlling transistor, said MOS state controlling transistor conducts to produce said known logic state on said output line.

17. The circuit of claim 16 wherein said MOS state controlling transistor and said one of said MOS logic transistors of said second pair of MOS logic transistors are PMOS transistors.

18. The circuit of claim 12 further comprising a resistor connected between said control element of said MOS state controlling transistor and said reference potential source.

19. A method for forcing a logic circuit to produce an output of known state when a supply voltage rises above a predetermined level, said logic circuit including an MOS logic transistor connected between a supply voltage source and an output line and connected to receive an input signal on a gate thereof, comprising:

connecting the output line of said logic circuit to a line at said known state by an output control transistor having a lower threshold voltage than a threshold voltage of a transistor of said logic circuit, said supply voltage source being connected to a control element of said output control transistor.

20. The circuit of claim 19 wherein said output control transistor is an NMOS transistor and said logic transistor is a PMOS transistor.

* * * * *